United States Patent
Kamath et al.

(10) Patent No.: US 10,224,884 B2
(45) Date of Patent: Mar. 5, 2019

(54) CIRCUIT FOR AND METHOD OF IMPLEMENTING A MULTIFUNCTION OUTPUT GENERATOR

(71) Applicant: Xilinx, Inc., San Jose, CA (US)

(72) Inventors: Umanath R. Kamath, Citywest (IE); John K. Jennings, Glenageary (IE); Adrian Lynam, Ashbourne (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/426,917

(22) Filed: Feb. 7, 2017

(65) Prior Publication Data

US 2018/0226929 A1 Aug. 9, 2018

(51) Int. Cl.
| | |
|---|---|
| *H03F 3/04* | (2006.01) |
| *H03F 3/08* | (2006.01) |
| *G01K 7/00* | (2006.01) |
| *G01K 7/01* | (2006.01) |
| *G01K 7/16* | (2006.01) |
| *H04L 27/00* | (2006.01) |
| *H03F 3/68* | (2006.01) |
| *H03F 3/45* | (2006.01) |
| *H03F 1/02* | (2006.01) |
| *H03G 3/00* | (2006.01) |
| *H03M 1/00* | (2006.01) |

(Continued)

(52) U.S. Cl.
CPC ............ *H03F 3/4508* (2013.01); *G01K 7/01* (2013.01); *G05F 3/30* (2013.01); *H03F 1/0216* (2013.01); *H03F 3/45475* (2013.01); *H03G 3/001* (2013.01); *H03M 1/00* (2013.01); *H03F 2200/213* (2013.01); *H03F 2200/261* (2013.01); *H03F 2200/468* (2013.01); *H03F 2203/45514* (2013.01); *H03F 2203/45544* (2013.01); *H03G 3/30* (2013.01)

(58) Field of Classification Search
CPC ................. H03F 3/4508; H03F 1/0216; H03F 2200/213; H03F 2200/468; H03G 3/001; H03G 3/30
USPC ........................... 327/530–546; 323/312–317
See application file for complete search history.

(56) References Cited

U.S. PATENT DOCUMENTS 5,059,820 A * 10/1991 Westwick ................. G05F 3/30
  323/314
5,945,871 A * 8/1999 Kausel ...................... G05F 3/30
  327/538

(Continued)

OTHER PUBLICATIONS

Souri, Ken et al., "A CMOS Temperature Sensor with a Voltage-Calibrated Inaccuracy of +/0.15C (3o) From -55C to -125C," IEEE Journal of Solid-State Circuits, Jan. 2013, pp. 292-301, vol. 48, No. 1, IEEE, Piscataway, New Jersey, USA.

*Primary Examiner* — Brandon S Cole
(74) *Attorney, Agent, or Firm* — John J. King (57) ABSTRACT

A circuit for implementing a multifunction output generator is described. The circuit comprises an amplifier circuit having a first input and a second input; a voltage generator coupled at a first node to a first input of the amplifier circuit; a controllable current source configured to provide a variable current to the first node; and a switching circuit enabling the operation of the amplifier circuit in a first mode for sensing a temperature and a second mode for providing a reference voltage. A method of implementing a multifunction output generator is described.

20 Claims, 10 Drawing Sheets

(51) Int. Cl.
    *G05F 3/30*     (2006.01)
    *H03G 3/30*     (2006.01)

(56) References Cited

U.S. PATENT DOCUMENTS

| | | | |
|---|---|---|---|
| 5,982,221 A * | 11/1999 | Tuthill | G01K 7/01 |
| | | | 257/E23.08 |
| 6,060,874 A * | 5/2000 | Doorenbos | G05F 3/30 |
| | | | 323/316 |
| 6,819,163 B1 * | 11/2004 | Gregoire, Jr. | G05F 3/262 |
| | | | 327/536 |
| 7,312,648 B2 * | 12/2007 | Yang | G01K 7/01 |
| | | | 327/512 |
| 7,737,779 B2 | 6/2010 | Summerfield et al. | |
| 7,741,906 B1 | 6/2010 | Summerfield | |
| 7,746,167 B1 | 6/2010 | Summerfield | |
| 7,830,985 B2 | 11/2010 | Black et al. | |
| 8,290,728 B2 * | 10/2012 | Drapkin | G01K 7/01 |
| | | | 324/750.28 |
| 9,013,231 B1 * | 4/2015 | Manea | G05F 3/30 |
| | | | 327/539 |
| 9,054,645 B1 | 6/2015 | Wang et al. | |
| 9,148,623 B2 | 9/2015 | Venkatachalam Jayaraman et al. | |
| 9,490,832 B1 | 11/2016 | Zhou et al. | |
| 9,501,078 B2 * | 11/2016 | Manea | G05F 3/30 |
| 2006/0093016 A1 * | 5/2006 | McLeod | G01K 1/028 |
| | | | 374/178 |
| 2010/0161261 A1 * | 6/2010 | Drapkin | G01K 7/01 |
| | | | 702/65 |
| 2010/0282946 A1 * | 11/2010 | Yin | H01L 27/14643 |
| | | | 250/214 A |

\* cited by examiner

CIRCUIT FOR AND METHOD OF IMPLEMENTING A MULTIFUNCTION OUTPUT GENERATOR

TECHNICAL FIELD

The present invention relates generally to integrated circuit devices, and in particular, to a circuit for and a method of implementing a multifunction output generator.

BACKGROUND

In order to reduce the size and power of consumer electronics products, there is an effort to reduce the size and power of various integrated circuit devices incorporated in the consumer electronics products. In many circumstances, certain circuits may only be used once or infrequently. Even circuits that are not used frequently will not only unnecessarily take up space, but may draw power when not in use and therefore affect the efficiency of the consumer electronics product. Accordingly, it is important to efficiently implement circuits to reduce both the area occupied by certain circuits and the power consumed by those circuits.

Conventionally, a bipolar junction transistor (BJT) core is made up of a pair of BJTs which can either be identical (1:1) or of a fixed ratio (1:m). The BJT core difference output voltage (i.e. delta Vbe which is proportional to absolute temperature) is amplified using fixed gain 'N' based amplifier circuit. A generic analog-to-digital converter (ADC) measures this input temperature dependent voltage against the temperature independent reference voltage. Disadvantages of this arrangement for measuring temperature include that its gain is fixed irrespective of the input signal amplitude, it requires large area (due to the associated BJT matching requirement, an operation transconductance amplifier (OTA), and resistors involved in various signal conditioning), and it exhibits inaccuracies due to the associated circuit block that it drives. Since both the input temperature dependent voltage and the temperature independent reference voltage are required to be generated, it consumes both area and power.

Accordingly, circuits and methods that reduce the area and power used by an integrated circuit beneficial.

SUMMARY

A circuit for implementing a multifunction output generator is described. The circuit comprises an amplifier circuit having a first input and a second input; a voltage generator coupled at a first node to a first input of the amplifier circuit; a controllable current source configured to provide a variable current to the first node; and a switching circuit enabling the operation of the amplifier circuit in a first mode for sensing a temperature and a second mode for providing a reference voltage.

A method of implementing a multifunction output generator is also described. The circuit comprises providing an amplifier circuit having a first input and a second input; configuring a voltage generator to provide a voltage generated at a first node to a first input of the amplifier circuit; controlling a current source configured to provide a variable current to the first node; and enabling the operation of the amplifier circuit in a first mode for sensing a temperature and a second mode for providing a reference voltage.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuit and methods describe a re-configurable circuit architecture capable of performing temperature sensing as well as reference voltage generation, such as bandgap voltage generation. The application for such a circuit is in distributed temperature monitoring or supply voltage monitoring across integrated circuit device, such as Field Programmable Gate Array (FPGA) or a System-on-Chip (SoC). One advantage of the circuits and methods is that they consume low area, provide configurable gain, can operate at a lower voltage supply, and can achieve high accuracy due to reduced mismatch contribution from components. Temperature sensing circuits are important functions associated with a large System-on-Chip (SoC) or a Field Programmable Gate Array (FPGA) or processor chips. BJT-based temperature sensors are interfaced to a generic ADC to provide a digital read-out. The interface circuit provides a fixed gain to the input signal. A generic ADC architecture requires at least two inputs including the voltage to be measured (which in this application is an amplified temperature dependent voltage) and a reference voltage. The reference voltage, which is temperature independent, may be used in full scale comparison for the unknown input.

Distributed temperature monitoring is a useful application for next generation SoC/FPGA devices. The circuits and methods for temperature monitoring consume minimal area overhead and deliver high performance (i.e. accuracy). While BJT-based temperature sensors use a large array of BJTS to reduce mismatch contributions and therefore consume a lot of area, the circuits set forth below provides temperature information from a single BJT for temperature sensing. The circuits and method adapt the gain amplification based on an input signal amplitude to maximize the dynamic range usage of the ADC. The circuit is also reconfigurable to enable a front-end to be used as a bandgap reference when not in temperature sensing mode. Therefore, the circuits and methods provide an adaptable gain and function as a front-end for a single BJT-based temperature sensor.

Figure 1:
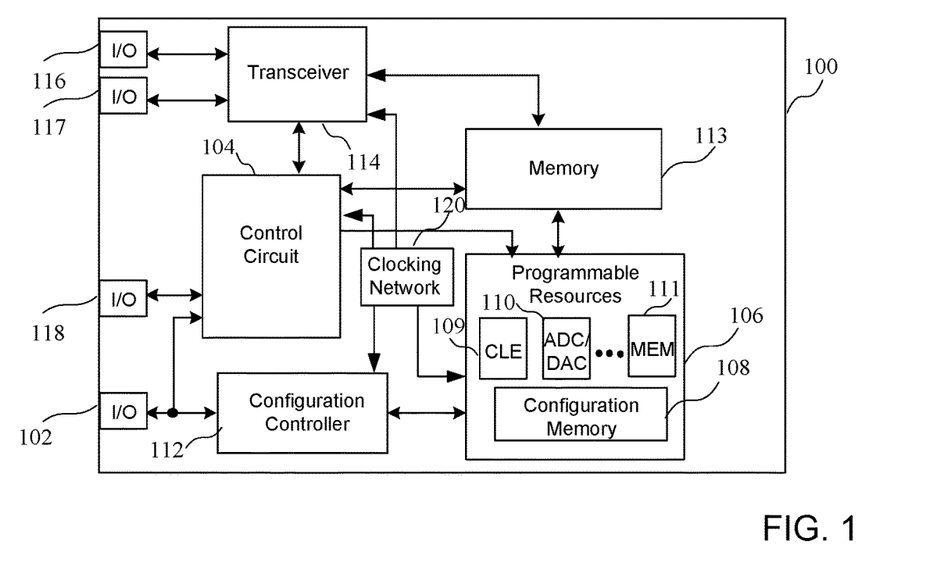
FIG. 1 is a block diagram of an integrated circuit comprising circuits for implementing multifunction output generators.

Turning first to FIG. 1, a block diagram of an integrated circuit 100 comprising a circuit for implementing multifunction output generators is shown. In particular, an input/output port 102 is coupled to a control circuit 104 that controls programmable resources 106 having configuration memory 108 having configurable logic elements 109, analog-to-digital (ADC) and digital-to-analog (DAC) circuit 110, and memory 111. Configuration data may be provided to the configuration memory 108 by a configuration controller 112. The configuration data enables the operation of the programmable resources 106. A memory 113 may be coupled to the control circuit 104 and the programmable resources 106. A transceiver circuit 114 may be coupled to the control circuit 104, programmable resources 106 and the memory 113, and may receive signals at the integrated circuit by way of I/O ports 116 and 117. It should be noted that the transceiver circuit 114 comprises a plurality of differential transmitters and differential transmitters, as described in more detail in the remaining figures. Other I/O ports may be coupled to circuits of the integrated circuit device, such as I/O port 118 that is coupled to the control circuit 104 as shown. A clocking network 120 is coupled to various elements of the circuit of FIG. 1. A multifunction output generator that provides both temperature sensing and reference voltage generation could be implemented with various functions of the circuit of FIG. 1. That is, the multifunction output generator could be implemented in various elements of the programmable resources and distributed throughout the IC, as will be described in more detail in reference to FIG. 2.

Figure 2:
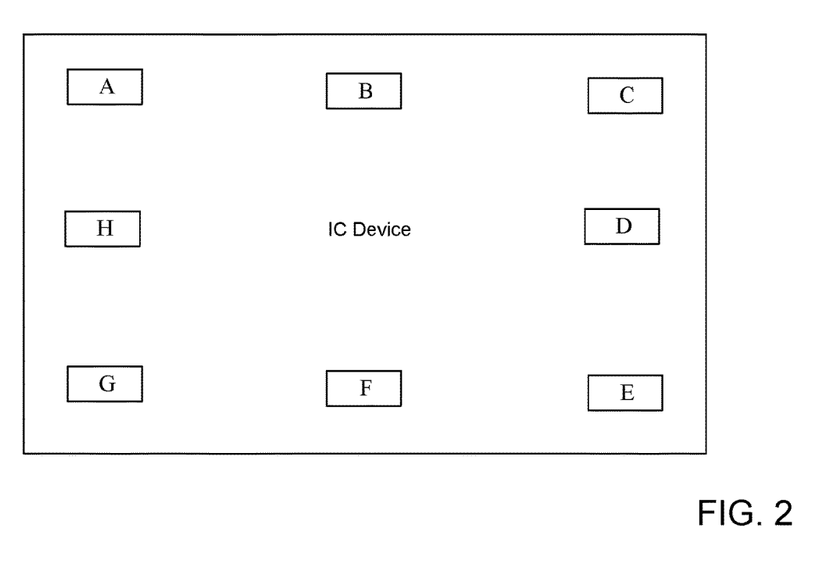
FIG. 2 is a block diagram of an integrated circuit having a plurality of circuits comprising multifunction output generators.

Turning now to FIG. 2, a block diagram of an integrated circuit having a plurality of circuits comprising multifunction output generators is shown. Multifunction output generator, also known as monitors designated A-H in FIG. 2, enable measuring temperature across the IC device. There can be a difference in temperature at remote locations of an IC due to activity, such as signal processing or data transfer. Sensing this temperature is important to the functioning of the monitor. However, area overhead can be significant for such a circuit. Therefore, the circuit architecture for temperature sensing should be implemented in an area-efficient manner, as will be described in more detail below. The multi-function output generator is re-configurable to provide a voltage reference when not used for temperature sensing. By implementing time-multiplexed functionality, the hardware can be re-used within the satellite monitors where area is a premium.

Figure 3:
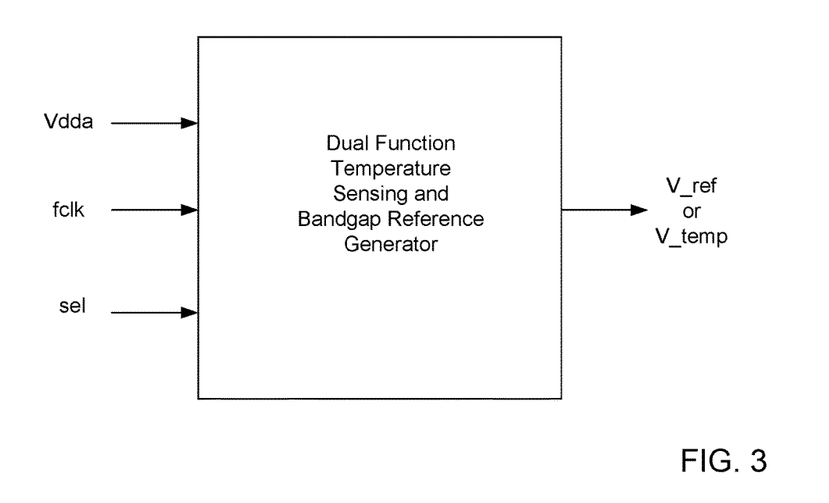
FIG. 3 is a block diagram of circuit implementing a dual-function temperature sensor and bandgap reference generator.
Figure 4:
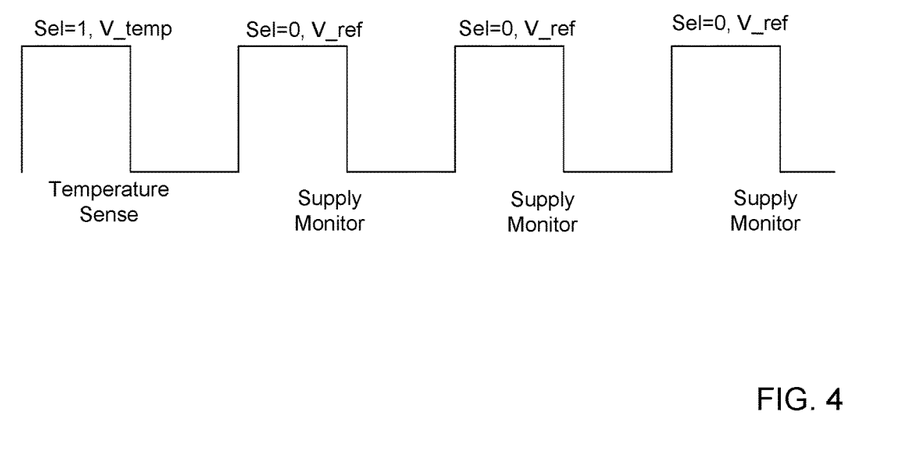
FIG. 4 is a timing diagram showing the selection of different functions of the circuit of FIG. 3.

Turning now to FIG. 3, a block diagram of circuit implementing a dual function temperature sensor and bandgap reference generator is shown. The circuit of FIG. 3 receives a reference voltage (Vdda), a clock signal (fclk), and a selection (sel) signal. Depending on the selection signal, the circuit functions to provide a bandgap reference voltage (e.g. 1.2V) for sel=0, or provides a voltage difference (Vbe-n*$\Delta$Vbe) which can be used to determine an on-chip temperature for sel=1, where the gain 'n' is tunable. A timing diagram of FIG. 4 shows the selection of different functions of the circuit of FIG. 3. Depending on functionality, the circuit of FIG. 3 is configurable and is controlled based upon a value of the selection signal. The timing diagram of FIG. 4 shows the functionality (i.e. temperature sensor function or supply monitor function based upon a generated reference voltage) and respective setting for the selection value where the output is denoted by V_temp or V_ref.

Figure 5:
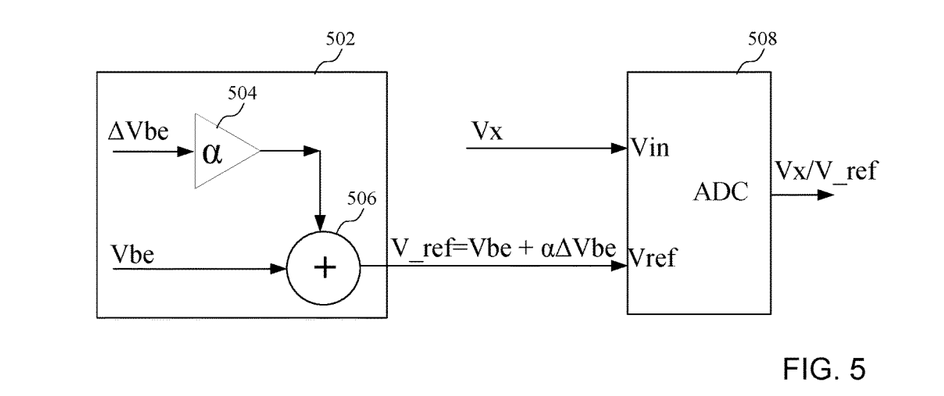
FIG. 5 is a block diagram showing the implementation of a multifunction output generator in a reference voltage generator operation mode.

Turning now to FIG. 5, a block diagram shows the implementation of a multifunction output generator in a reference voltage generator mode, such as generating a voltage of 1.2 volts for example. As will be described in more detail below, the reference voltage generator mode may be implemented by a bandgap generator, for example, where a reference voltage is based upon a base-emitter voltage of a BJT device. When the multifunction output generator is not used for a temperature sensing mode, it can be used to generate the reference voltage which is used to monitor a power supply voltage of the circuit for example. In this configuration when the selection signal is chosen to generate a bandgap voltage, gain '$\alpha$' is chosen to achieve approximate temperature compensation. A multifunction output generator 502 of FIG. 5, which operates as an interface to an ADC circuit for example, comprises an amplifier circuit 504 that is configured to receive a delta base-emitter voltage ($\Delta$Vbe). An output of the amplifier circuit 504 is provided to a first input of the adder circuit 506 and the base emitter voltage Vbe is provided to a second input of the adder circuit 506. A reference voltage V_ref is generated at the output of the adder circuit, where the reference voltage V_ref=Vbe+$\alpha\Delta$Vbe. That is, because Vbe has a negative temperature dependence and $\Delta$Vbe has a positive temperature dependence, the coefficient $\alpha$ is chooses so that V_ref is constant. The reference voltage may be provided to a reference input of an ADC circuit 508, which is also coupled to receive an input signal Vx, which may be a voltage from a power supply for example. The ADC circuit 508 will generate an output Vx/V_ref, as shown. That is, the multifunction output generator 502 is configured to generate a reference voltage that can be used by an ADC circuit to generate a digital output (Vx/V_ref) based upon the reference voltage V_ref, which is a reliable reference voltage generated by the multifunction output generator.

Figure 6:
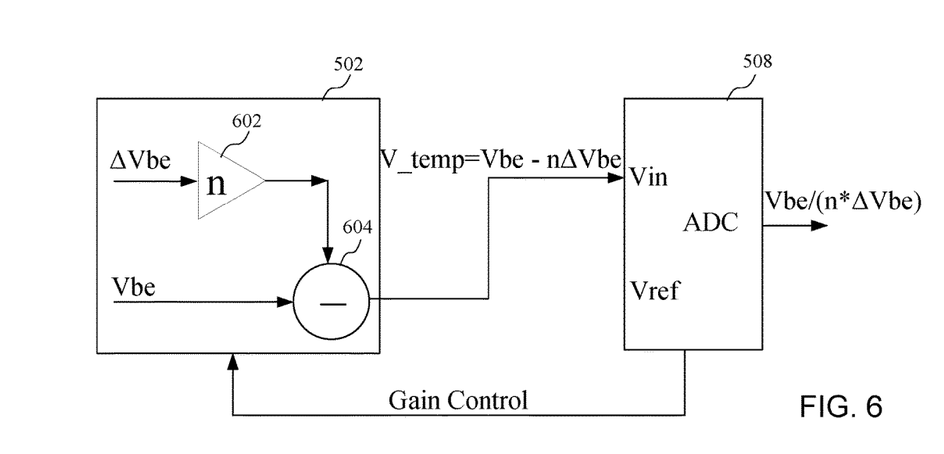
FIG. 6 is a block diagram showing the implementation of a multifunction output generator in a temperature sensing mode.

Turning now to FIG. 6, a block diagram shows the implementation of a multifunction output generator in a temperature sensing mode. When the multifunction amplifier is used in a temperature sensing mode, it is configured to provide V_temp as an output. In this configuration when the selection signal is chosen to provide a temperature output, the gain 'n' is chosen to provide a desired gain. The multifunction output generator 502 as configured in FIG. 6 comprises an amplifier 602 configured to receive the Vbe signal and generate an output that is coupled to a subtractor circuit 604. The subtractor circuit subtracts $n\Delta Vbe$ and generates an output reference voltage $Vbe-n\Delta Vbe$. Because $V\_temp=Vbe/(Vbe+n\Delta Vbe)$, then $V\_temp=(1/(1-(n\Delta Vbe/Vbe)))$. Therefore, by providing $Vbe-n\Delta Vbe$ to the Vin input of the ADC circuit 508, it is not necessary to provide a reference voltage to the ADC circuit. The output of the multifunction reference generator is coupled to the reference voltage input of the ADC 508, which generates an output $Vbe/(n*\Delta Vbe)$, which is a digital representation of the temperature. As will be described in more detail below, a single circuit can be implemented and configured to provide both functions of temperature sensing of FIG. 6 and reference voltage generation of FIG. 5 for voltage supply monitoring or of any analog signal measurement, including external and on-chip signals. The output of the multifunction output generator can be provided to appropriate input of an ADC circuit as shown in either FIG. 5 or 6 to generate a reference voltage or perform temperature sensing, as described. That is, depending upon the functionality of the multifunction output generator, different signals will be routed to the inputs of the ADC circuit, or in the case of implementing the multifunction output generator as a temperature sensor, it is not necessary that a signal is provided to the Vref input of the ADC circuit, as will be described in more detail below. By way of the example, the output of the multifunction output generator could be coupled either the Vin input or the Vref input of the ADC using any type of configurable circuit for routing data, such as a multiplexer or other programmable resources enabling routing.

Figure 7:
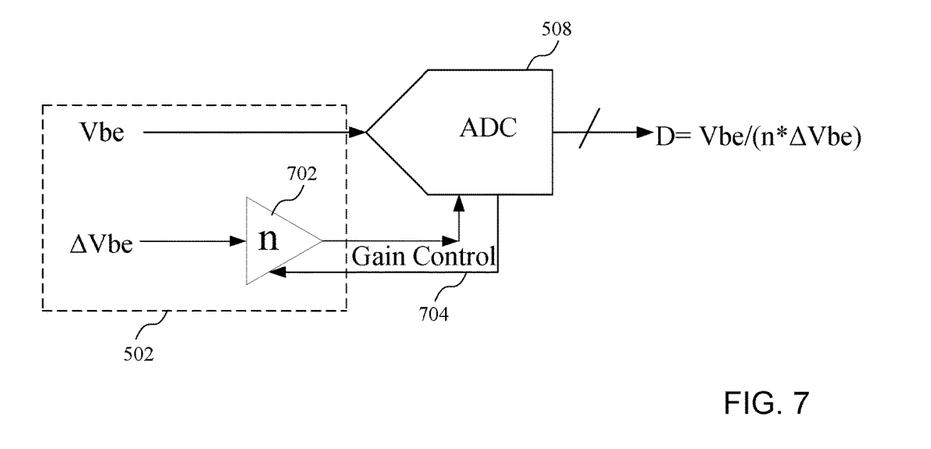
FIG. 7 is block diagram showing gain control of a multifunction output generator associated with an analog-to-digital converter circuit.

Turning now to FIG. 7, block diagram shows gain control of a multifunction output generator associated with an analog-to-digital converter circuit. The gain (n) of an amplifier 702 is chosen as maximum value for which V_temp is positive for given temperature. Vbe is balanced by a factor gain $n*\Delta Vbe$ to determine the temperature value from the digital code. Gain can be controlled by way of a gain control feedback line 704 so as to focus on a region where the input signal Vbe is present. Vbe changes with temperature, and more particularly is complementary to absolute temperature, while $\Delta Vbe$ is proportional to absolute temperature. So for any given temperature, it is possible to determine 2 settings designated n and n+1 for the gain such that, for the value n, $Vbe-(n*\Delta Vbe)$ is positive, and for the value of n+1, $Vbe-((n+1)*\Delta Vbe)$ is negative. Therefore, the gain value can be selected to enable a full range of the ADC operation. That is, enabling the selection of the gain value n helps to optimize the dynamic range of the ADC depending upon the input. Therefore, the implementation of the multifunction output generator with an ADC circuit not only reduces circuit requirements and power consumption, but also provides an adaptive configurable gain to maximize the utilization of the ADC dynamic range.

Figure 8:
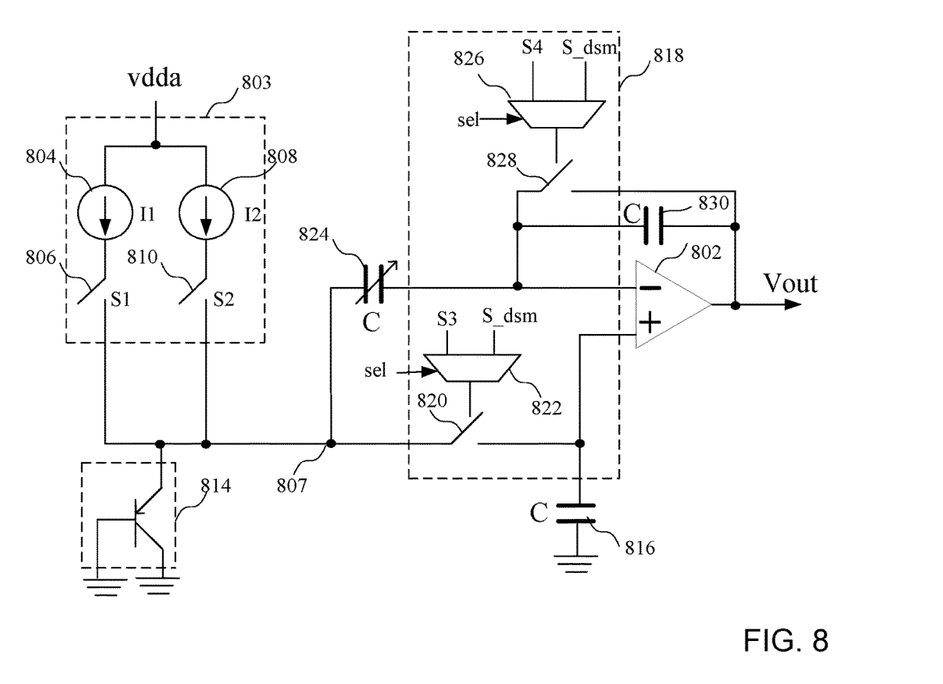
FIG. 8 is a block diagram of a circuit implementing a multifunction output generator to be operated in both a reference voltage generation mode and a temperature sensing mode.

Turning now to FIG. 8, a block diagram of a circuit enabling a multifunction output generator to be implemented in both a bandgap operation mode and a temperature sensing mode is shown. The circuit of FIG. 8 may be implemented as the multifunction output generator 502 for example. More particularly, an operational amplifier 802 is configured to receive a reliable reference voltage (shown a base-emitter voltage which the voltage between the base and the emitter of a bi-polar junction (BJT) transistor) at a first input, shown here as the positive input of the operational amplifier 802. The positive input to the operational amplifier 802 is coupled to a controllable current source, which generates a voltage at the positive input. The controllable current source 803 may comprise one or more current sources, shown here as a first current source 804 coupled to a reference voltage (vdda), controlled by a switch 806 (designated as switch 51) coupled to a node 807 and a second current source 808 controlled by a switch 810 (designated as switch S2) coupled to the node 807. A voltage generator 814 is coupled between the node 807 and ground. While the voltage generator 814 is shown here as a PNP BJT transistor having its base coupled to ground, it should be understood that the voltage generator 814 could also be configured as an NPN bi-polar junction transistor, or any other junction diode.

As will be described in more detail below, the switches 806 and 810 are controlled to generate a certain voltage, shown here as a base-emitter voltage Vbe, at the node 807. More particularly, Vbe1 can be generated when the switch 806 is closed and Vbe2 can be generated when switch 810 is closed. A capacitor 816 is coupled between the positive input of the operational amplifier 802 and ground, where the charging of the capacitor 816 is determined by a switch 820 of a switching circuit 818 between the node 807 and a terminal of the capacitor 816 at a positive input of the amplifier 802. The switch 820 is controlled by a selection circuit 822, shown here as a multiplexer, configured to receive a plurality of inputs that can be selected in response to a selection signal. The selection circuit 822 receives a signal S3 at a first input and a signal S_dsm at a second input. The selection of the input signals associated with the selection circuit 822 will be described in more detail below.

A controllable capacitor 824 is coupled between the node 807 and the negative input of the operational amplifier, where the voltage on the positive input of the operational amplifier is designated as Vbe1 or Vbe2 depending upon the current provided by the current source 802. The controllable capacitor 824 may be a voltage controllable capacitor or a bank of capacitors that can be configured to provide a certain capacitance for example. A second selection circuit 826 is configured to control a switch 828 that enables bypassing a capacitor coupled between the negative input and the output of the amplifier 802. It should be noted that each of the capacitors 816, 824, and 830 have a capacitance value C, but where capacitor 824 has a variable value $\alpha C$. The second selection circuit 826 is also shown as a multiplexer configured to select one of the S4 signal at a first input and the S-dsm signal at a second input in response to the selection (sel) signal. That is, the selection signal will enable the opening and closing of the switches, as will be described in more detail in FIGS. 9-14. An output signal Vout is generated at an output of the operational amplifier 802.

One benefit of the circuit of FIG. 8 is that it can inherently be used both for providing a voltage reference for generic analog voltage measurement applications and a voltage reference for providing temperature sensing. The implementation of FIG. 8 includes a single BJT configured as a diode into which two different currents are injected during different phases, where I1:I2 has a ratio of 1:N. The controllable current source 803 enables generating two different base-emitter junction voltages Vbe1 and Vbe2, which are combined together using a switched capacitor circuit to generate a temperature voltage:

$$V\_temp = Vbe1 - n*(Vbe2 - Vbe1) \quad \text{equation 1,}$$

where V_temp=output voltage Vbe1 and Vbe2 are the base-emitter junction voltages when I1 and I2 are injected into the BJT, and n=capacitor ratio deciding the weight factor, which is adaptable to input range, as will be described in reference to FIGS. 9-11. In a generic analog voltage measurement mode of the ADC, 'α' is chosen to obtain first order temperature independence for a Vout voltage of approximately 1.2V for example to be generated as reference, where $$V\_ref = Vbe1 + \alpha*(Vbe2 - Vbe1) \quad \text{equation 2.}$$

Conventionally, in the temperature sensing operation, the generic ADC determines the ratio of n*(Vbe2−Vbe1) to Vbe1+n*(Vbe2−Vbe1). This ratio is linearly dependent on temperature. The knowledge of temperature can also be obtained by balancing (Vbe2−Vbe1) with respect to Vbe1, thus obviating the need for generation of the reference voltage. In the temperature sensing operation, the equation 1 operation is performed. Parameter 'n' is a digitally selected value since it has to bring n*(Vbe2−Vbe1) closest to Vbe1 for a given temperature. Thus, the value of the gain 'n' maximizes the dynamic range usage for the ADC. The ADC may be implemented using a sigma-delta converter or any other ADC topology which are suitable for such a front-end multifunction output generator.

For given temperature 'T', the multifunction output generator provides V_temp=(Vbe1−n*ΔVbe), where the gain 'n' is increased linearly or in binary manner. For every digital selection of n, V_temp is evaluated to determine if it is positive or negative using the comparator available within an ADC. The maximum value of 'n' which provides V_temp positive is chosen for the temperature-to-digital conversion.

Figure 9:
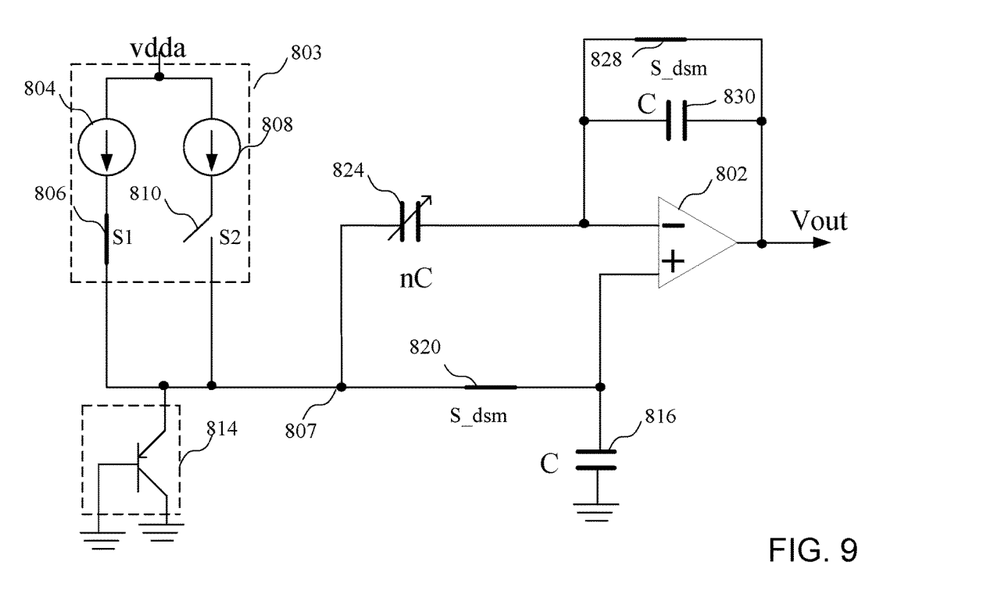
FIG. 9 is a block diagram of the circuit of FIG. 8 in a phase-0 of a temperature sensing mode.
Figure 10:
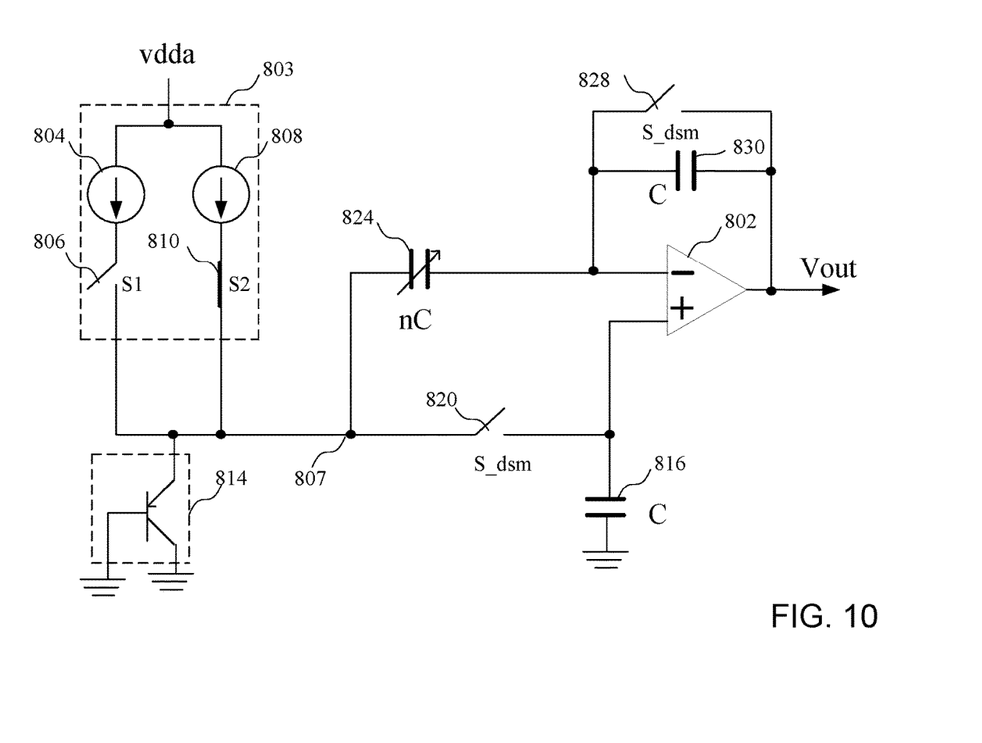
FIG. 10 is a block diagram of the circuit of FIG. 8 in a phase-1 of a temperature sensing mode.
Figure 11:
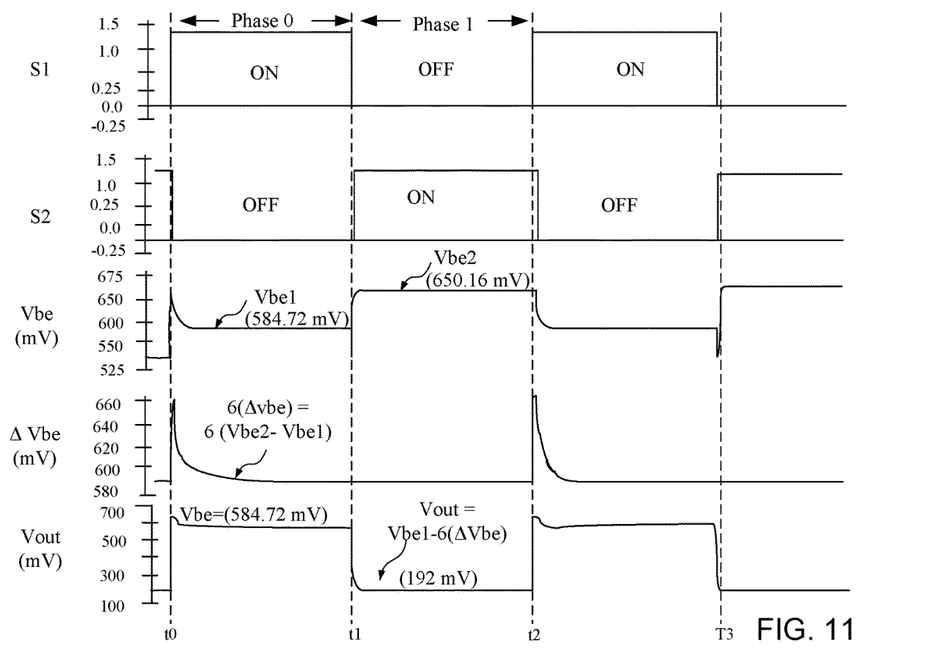
FIG. 11 is a graph showing the operation of a multifunction output generator during a temperature sensing operation.

Turning now to FIGS. 9-11, a temperature sensing operation is shown, with a phase 0 of temperature sensing as shown in FIG. 9, wherein the capacitor 816 is charged to Vbe1. The buffer configuration of the amplifier 802 ensures parasitic capacitances are also charged to Vbe1. In a phase 1 of a temperature sensing operation n*C (i.e. the charge across variable capacitor 824) is charged to ΔVbe. The feedback node at the negative input of the amplifier 802 settles to Vout, which is (Vbe−nΔVbe), where charge conservation during redistribution ensures that n*C*(Vbe2−Vbe1)=C*(Vbe1−Vout), and Vout=Vbe1−nΔVbe, where ΔVbe=Vbe2−Vbe1.

The operation of a multifunction output generator during a temperature sensing operation is shown in the timing diagrams of FIG. 11 using an "n" value of 6.

As can be seen in FIG. 11, the switch 806 is closed and the switch 810 is open during phase 0, during which Vbe1 is shown at approximately 625 mV. During a phase 1, the switch 806 is open and the switch 810 is closed, during which Vbe2 is approximately 650 mV. The value of nΔVbe for n=6 shows the falling of the value to approximately 600 mV. Finally, Vout varies from approximately 600 mV in phase 0 and 200 mV in phase 1.

Figure 12:
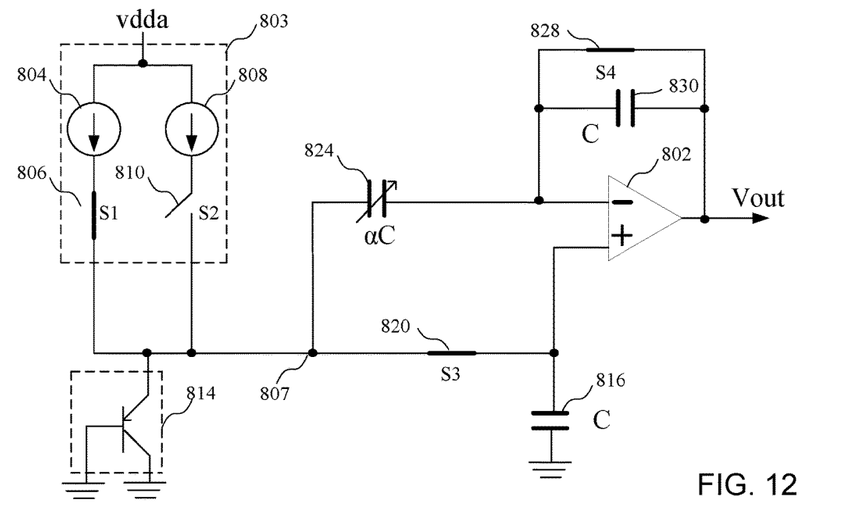
FIG. 12 is a block diagram of the circuit of FIG. 8 in a phase-0 of a reference generator mode.
Figure 13:
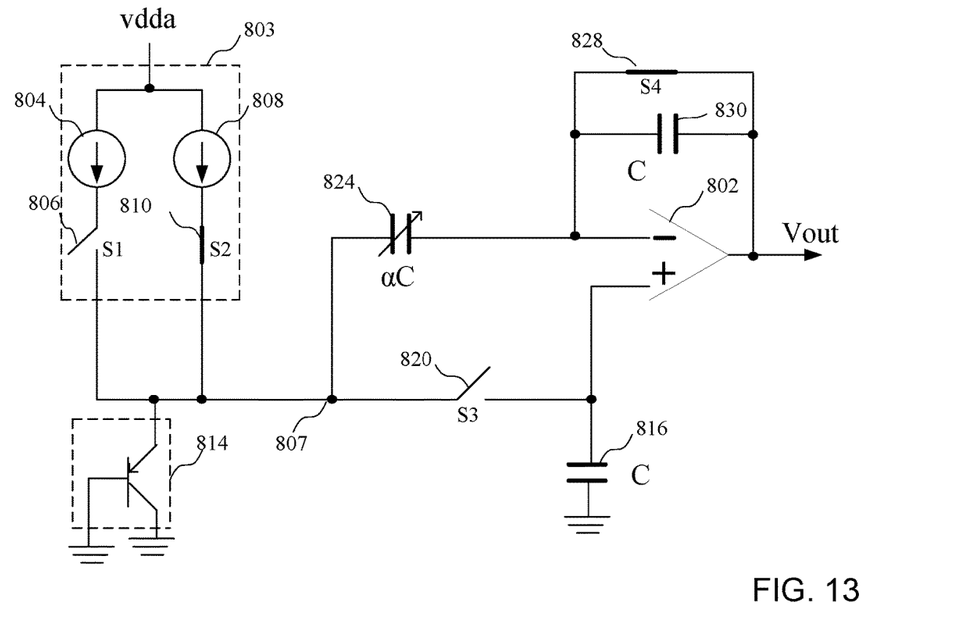
FIG. 13 is a block diagram of the circuit of FIG. 8 in a phase-1 of a reference generator mode.
Figure 14:
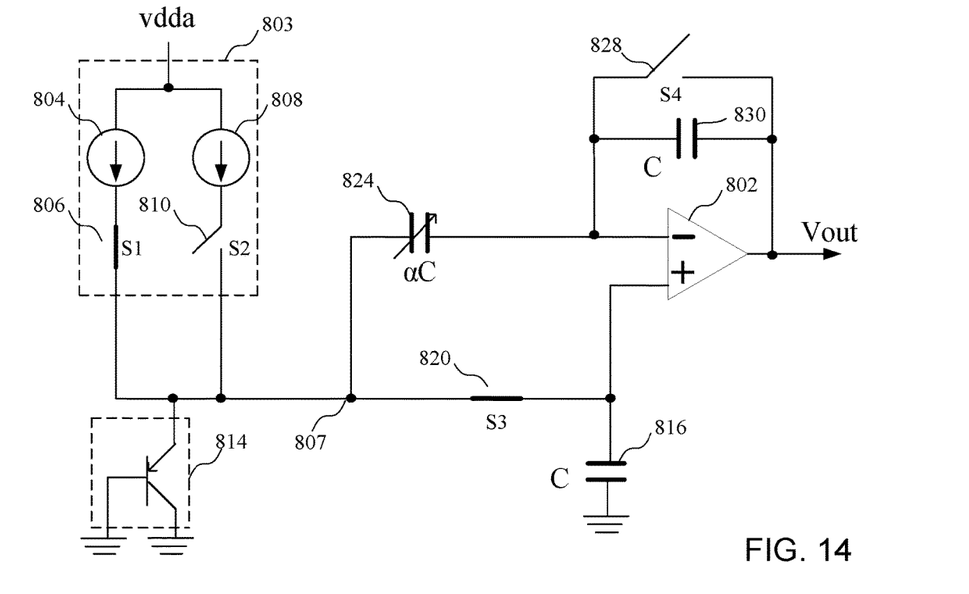
FIG. 14 is a block diagram of the circuit of FIG. 8 in a phase-2 of a reference generator mode.
Figure 15:
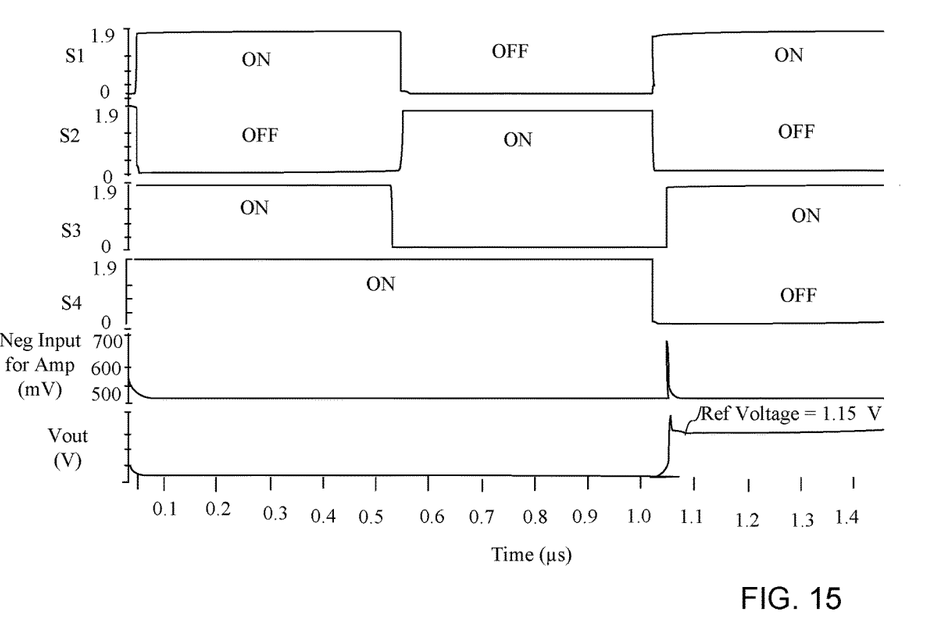
FIG. 15 is a graph showing the operation of a multifunction output generator during a reference voltage generator mode.

Turning now to FIGS. 12-15, 3 phases of a reference voltage generation operation are shown. During a phase 0 as shown in FIG. 12, the capacitor 816 is charged to Vbe with switches 506 and 820 closed. During phase 1 as shown in FIG. 13, switch 810 is now closed, switches 806 and 820 are opened, and capacitor 824 is charged to ΔVbe, where the charge stored is αC*ΔVbe. In phase 2 of the reference voltage generation process, switches 806 and 820 are closed and switch 828 is opened. This changes the voltage on positive terminal of the amplifier to Vbe1. The negative terminal which is at Vbe1 due to negative feedback resets α*C. Consequently, current flows from Vout, which keeps increasing, to charge feedback capacitor 830, where α*C*ΔVbe=C(Vout−Vbe1), and therefore Vout=Vbe1+α*ΔVbe. As shown in FIG. 15, the output voltage Vout of approximately 1.15 volts is based upon the temperature independent bandgap voltage Vbe and used for voltage monitoring a reference voltage to compensate for temperature variations.

Figure 16:
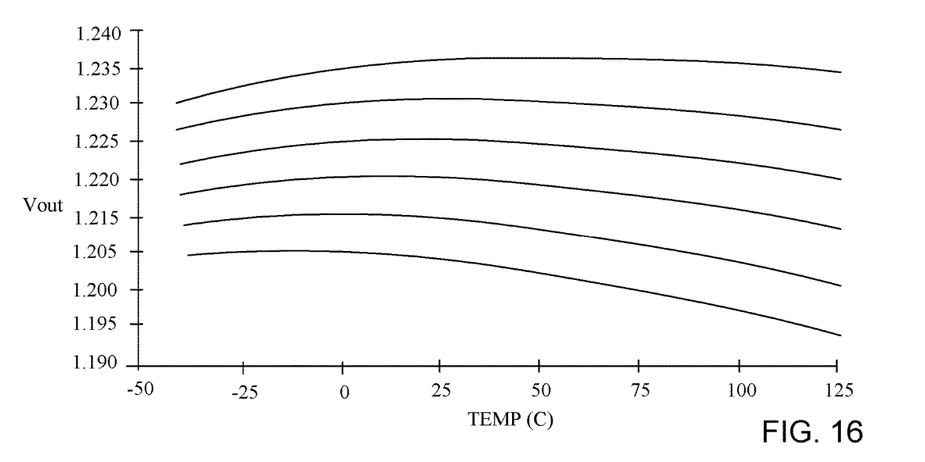
FIG. 16 is a graph showing first order temperature independence for a bandgap operation.

The graph of FIG. 16 shows a first order temperature independence for bandgap operation. The graph shows Vout in the reference voltage mode versus temperature (C). The various curves represent the various process corners, and for each process corner the curve represents the accuracy of the reference (i.e. max-min will be the accuracy across the whole temperature range). The overall process variation can be trimmed using other known techniques to improve the accuracy across temperature, such as using second order curvature correction. However, as is clear from the various plots of Vout, the output voltage Vout is relatively flat over a wide range of temperatures.

Turning now to 17, a flow chart shows a method of implementing a dual function temperature sensing and bandgap reference generator. The method of FIG. 17 could be implemented using the circuit of FIG. 8 as described above in reference to FIGS. 9-15, or some other suitable circuit. An amplifier circuit having a first input and a second input is provided at a block 1702. The amplifier circuit could be amplifier circuit 802 for example. The voltage A voltage generator, such as voltage generator 814, is configured at a first node to a first input of the amplifier circuit at a block 1704. A current source configured to provide a variable current to the first node is controlled at a block 1706. The current source could be implemented as described above in reference to the current source 803, for example. The operation of the amplifier circuit in a first mode for sensing a temperature and a second mode for providing a reference voltage is enabled at a block 1708. The amplifier circuit may be enabled to operate in a temperature sensing mode and reference voltage mode by the charging and discharging of capacitors as described above in reference to FIGS. 8-15, or some other suitable means.

Figure 17:
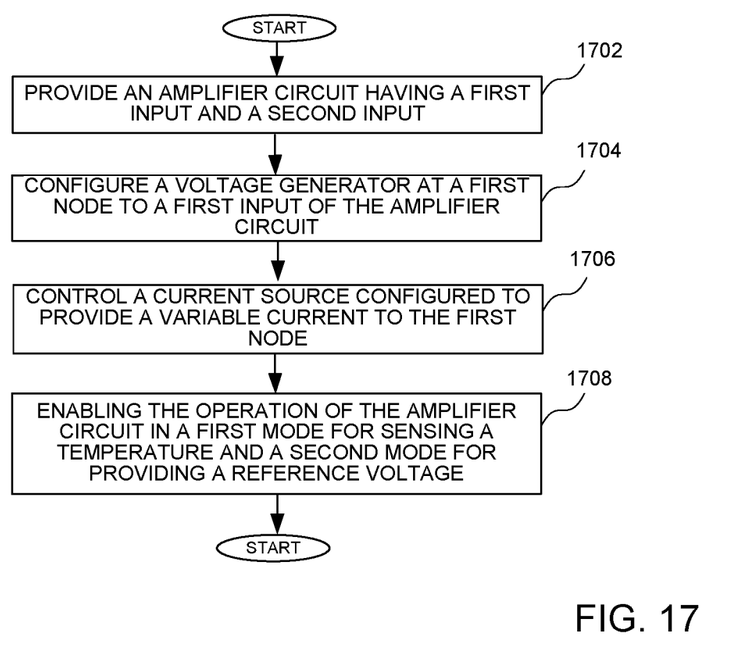
FIG. 17 is a flow chart showing a method of implementing a dual-function temperature sensor and reference voltage generator.
Figure 18:
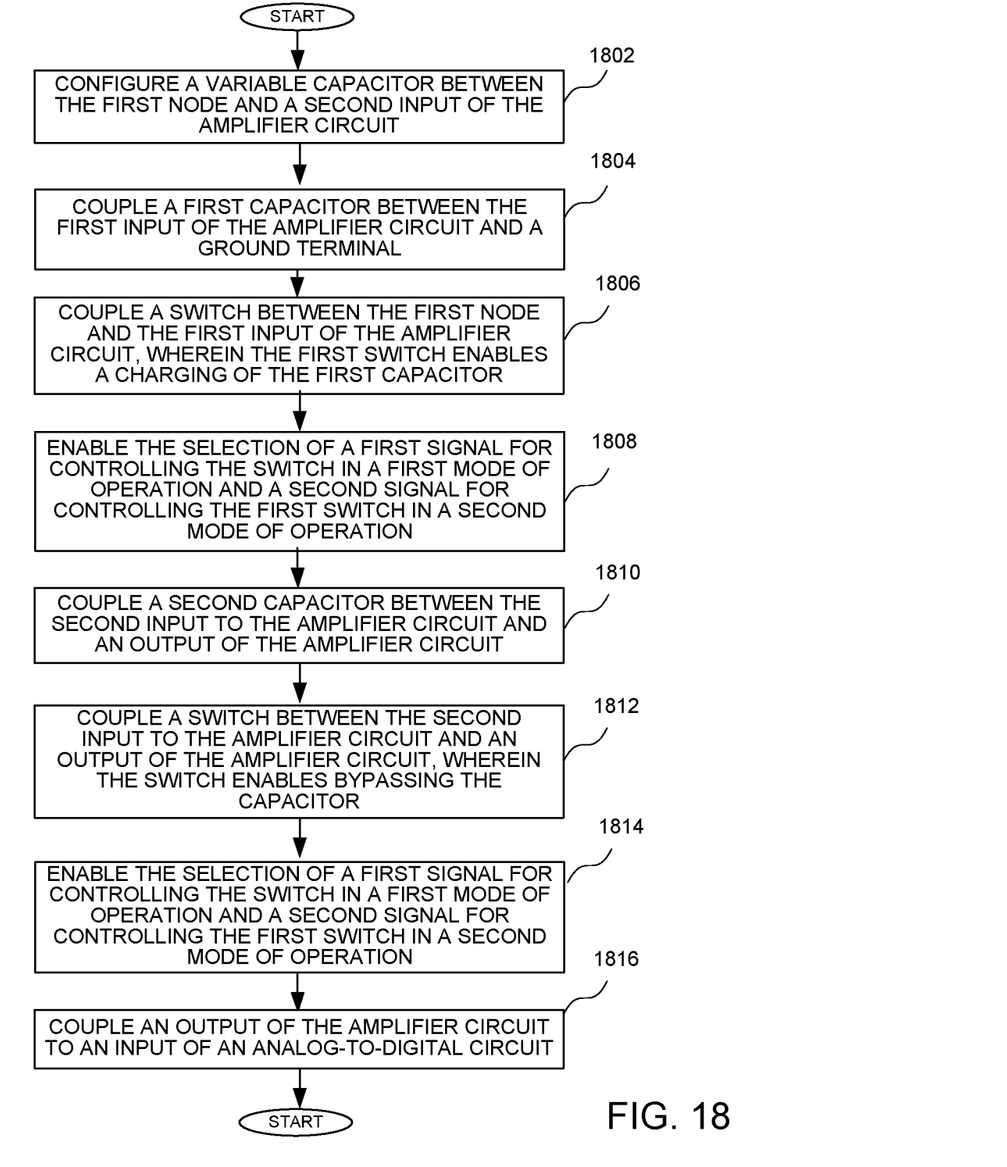
FIG. 18 is another flow chart showing a method of implementing a dual-function temperature sensor and reference voltage generator.

Turning now to FIG. 18, another flow chart shows a method of implementing a dual-function temperature sensor and reference voltage generator, and more particularly enabling the operation of the multifunction circuit in a first mode for sensing a temperature and a second mode for providing a reference voltage at block 1708 of FIG. 17 for example. A variable capacitor configured between the first node and a second input of the amplifier circuit at a block 1802. The variable capacitor could be a voltage variable capacitor or a bank of capacitors that could be switched in an out. A first capacitor is coupled between the first input of the amplifier circuit and a ground terminal at a block 1804. A switch is coupled between the first node and the first input of the amplifier circuit, wherein the first switch enables a charging of the first capacitor at a block 1806. The selection of a first signal for controlling the switch in a first mode of operation and a second signal for controlling the first switch in a second mode of operation is enabled at a block 1808. The first and second modes of operation could include a reference voltage generator mode of operation and a temperature sensing mode.

A second capacitor is coupled between the second input to the amplifier circuit and an output of the amplifier circuit at a block 1810. A switch is coupled between the second input to the amplifier circuit and an output of the amplifier circuit, wherein the switch enables bypassing the capacitor at a block 1812. The selection of a first signal for controlling the switch in a first mode of operation and a second signal for controlling the first switch in a second mode of operation is enabled at a block 1814. That is, the switches can be selected as describe above in reference to FIGS. 11 and 15 to enable the first and second mode of operation. An output of the amplifier circuit is coupled to an input of an analog-to-digital circuit at a block 1816.

The circuit and methods enable the use of reconfigurable circuit having a single BJT device to perform two time-multiplexed operations. The gain is adaptable to an input signal and is implemented using a variable capacitor, which may be a switched capacitor circuit. The circuits and methods reduce mismatch implemented related inaccuracies since the capacitor ratio associated with capacitors in deep submicron technology provide better matching. The circuits and methods use the full ADC dynamic range to improve temperature sensing. In a temperature sensing mode, the interface circuit combines the first stage operation for a generic sigma-delta converter or for slope based analog-to-digital converter, and therefore saves area of additional circuitry while improving accuracy as front-end is integrated with the sensor. Because both analog voltage monitoring and temperature sensing are typically time-multiplexed inputs to the ADC, the circuits and methods provide an area-efficient implementation for both circuits and are capable of producing high accuracy front-end signal conditioning for such applications.

It can therefore be appreciated that new to circuits for and methods of providing a multifunction output generator have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for implementing a multifunction output generator, the circuit comprising:
    an amplifier circuit having a first input and a second input;
    a voltage generator coupled at a first node to a first input of the amplifier circuit;
    a controllable current source configured to provide a variable current to the first node; and
    a switching circuit enabling the operation of the amplifier circuit in a first mode for sensing a temperature and a second mode for providing a reference voltage,
    wherein in the first mode, an output of the multifunction output generator is a temperature signal, and in the second mode, the output of the multifunction output generator is a voltage reference signal,
    wherein the switching circuit is configured to time-multiplex the temperature signal and the voltage reference signal on the output of the multifunction output generator.

2. The circuit of claim 1 wherein the controllable current source comprises a first current source and a second current source, and the variable current is based upon a selection of at least one of the first current source and the second current source.

3. The circuit of claim 1 further comprising a variable capacitor coupled between the first node and a second input of the amplifier circuit, a first capacitor coupled between the first input of the amplifier circuit and a ground terminal, and a second capacitor coupled between the second input to the amplifier circuit and an output of the amplifier circuit.

4. The circuit of claim 3 wherein the switching circuit comprises a first switch coupled between the first node and the first input of the amplifier circuit, to enable a charging of the first capacitor, and a second switch coupled between the second input to the amplifier circuit and an output of the amplifier circuit, to enable bypassing the second capacitor.

5. The circuit of claim 4 wherein the switching circuit enables the amplifier circuit to determine a change in a voltage generated by the voltage generator.

6. The circuit of claim 4 wherein, during a first phase of operation of the first mode, the controllable current source provides a first current to the first node, the first switch is closed to charge the first capacitor, and the second switch is closed to bypass the second capacitor.

7. The circuit of claim 6 wherein, during a second phase of operation of the first mode, the controllable current source provides a second current to the first node, the first switch is open to decouple the controllable current source from the first capacitor, and the second switch is open to couple the second capacitor between the second input of the amplifier circuit and the output of the amplifier circuit.

8. The circuit of claim 4 wherein, during a first phase of operation of the second mode, wherein the controllable current source provides a first current to the first node, the first switch is closed to charge the first capacitor, and the second switch is closed to bypass the second capacitor.

9. The circuit of claim 8 wherein, during a second phase of operation of the second mode, the controllable current source provides a second current to the first node, the first switch is open to decouple the first capacitor from the controllable current source, and the second switch is closed to bypass the second capacitor.

10. The circuit of claim 9 wherein, during a third phase of operation of the second mode, the controllable current source provides the first current to the first node, the first switch is closed to charge the first capacitor, and the second switch is open to couple the second capacitor between the second input of the amplifier circuit and the output of the amplifier circuit.

11. The circuit of claim 1 wherein the voltage generator comprises a bandgap reference voltage generator.

12. The circuit of claim 1 further comprising an analog-to-digital converter, wherein an output of the amplifier circuit is coupled to an input of the analog-to-digital circuit.

13. The circuit of claim 12 further comprising a gain control signal enabling a selection of gain of the amplifier circuit based upon an input signal magnitude.

14. A method of implementing a multifunction output generator, the circuit comprising:
    providing an amplifier circuit having a first input and a second input;
    configuring a voltage generator to prove a voltage generated at a first node to a first input of the amplifier circuit;
    controlling a current source configured to provide a variable current to the first node;

enabling the operation of the amplifier circuit in a first mode for sensing a temperature and a second mode for providing a reference voltage; and, outputting an output of the multifunction output generator, wherein in the first mode, an output of the multifunction output generator is a temperature signal, and in the second mode, the output of the multifunction output generator is a voltage reference signal, wherein the switching circuit is configured to time-multiplex the temperature signal and the voltage reference signal on the output of the multifunction output generator.

15. The method of claim 14 further comprising, in a first phase of operation of the first mode, providing a first current to the first node, closing a first switch to charge a first capacitor, and closing a second switch to bypass a second capacitor.

16. The method of claim 15 further comprising, in a second phase of operation of the first mode, providing a second current to the first node, opening the first switch to decouple the controllable current source from the first capacitor, and opening the second switch to couple the second capacitor between the second input of the amplifier circuit and the output of the amplifier circuit.

17. The method of claim 14 further comprising, in a first phase of operation of the second mode, providing a first current to the first node, closing a first switch to charge a first capacitor, and closing a second switch to bypass a second capacitor.

18. The method of claim 17 further comprising, in a second phase of operation of the second mode, providing a second current to the first node, opening the first switch to decouple the first capacitor from the controllable current source, and closing the second switch to bypass the second capacitor.

19. The method of claim 18 further comprising, in a third phase of operation of the second mode, providing the first current to the first node, closing the first switch to charge the first capacitor, and opening the second switch to couple the second capacitor between the second input of the amplifier circuit and the output of the amplifier circuit.

20. The method of claim 14 further comprising coupling an output of the amplifier circuit to an input of an analog-to-digital circuit and providing a gain control signal based upon an input signal magnitude to the amplifier circuit.

* * * * *